United States Patent
Haskal

(10) Patent No.: US 9,268,162 B2
(45) Date of Patent: Feb. 23, 2016

(54) ELECTRONIC DEVICE HAVING A PLASTIC SUBSTRATE

(75) Inventor: Eliav Itzhak Haskal, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 680 days.

(21) Appl. No.: 12/446,476

(22) PCT Filed: Oct. 24, 2007

(86) PCT No.: PCT/IB2007/054322
§ 371 (c)(1),
(2), (4) Date: Apr. 21, 2009

(87) PCT Pub. No.: WO2008/050300
PCT Pub. Date: May 2, 2008

(65) Prior Publication Data
US 2010/0323170 A1    Dec. 23, 2010

(30) Foreign Application Priority Data
Oct. 27, 2006   (EP) ..................... 06123059

(51) Int. Cl.
*H01J 9/24* (2006.01)
*G02F 1/1333* (2006.01)
*H01L 27/12* (2006.01)
*G02F 1/1362* (2006.01)
*G02F 1/167* (2006.01)
*H01L 29/786* (2006.01)
*H01L 51/00* (2006.01)

(52) U.S. Cl.
CPC ...... *G02F 1/133305* (2013.01); *H01L 27/1214* (2013.01); *H01L 27/1266* (2013.01); *G02F 1/1362* (2013.01); *G02F 1/167* (2013.01); *H01L 29/78603* (2013.01); *H01L 51/0097* (2013.01); *Y10T 428/24802* (2015.01); *Y10T 428/24942* (2015.01)

(58) Field of Classification Search
CPC ......................................... G09G 3/34
USPC ....................................... 445/23–25
See application file for complete search history.

(56) References Cited

FOREIGN PATENT DOCUMENTS

| JP | 02221922 A | 9/1990 |
|---|---|---|
| JP | 03093024 A | 4/1991 |
| WO | 2005050754 A1 | 6/2005 |

OTHER PUBLICATIONS

Liou et al. In Thin Solid Films 399 (1999) 68-73 "Thickness Dependence of the anisotropy in thermal expansion of PMDA-ODA and BPDA-PDA thin films".*
Ando, "Optical Properties of Fluorinated Polyimides and their Applications to Optical Components and Waveguide Circuits", Journal of Photopolymer Science and Technology, vol. 17, No. 2, 2004, p. 219-232.*

(Continued)

*Primary Examiner* — Andrew Coughlin

(57) ABSTRACT

A method of manufacturing a thin-film electronic device includes applying a plastic coating to a rigid carrier substrate for forming a plastic substrate. The plastic material has a coefficient of thermal expansion greater in a first direction perpendicular to the substrate plane than in a second direction parallel to the substrate plane. Thin film electronic elements are formed over the plastic substrate and the rigid carrier substrate is released from the plastic substrate by a heating process which expands the plastic substrate preferentially in a direction perpendicular to the substrate plane.

17 Claims, 8 Drawing Sheets

(56) References Cited

OTHER PUBLICATIONS

Pottiger, M.T., "The Effect of Orientation on Thermal Expansion Behavior in Polymide Films", Journal of Polymer Science, Part B, 1994.

Liou, H., "Thickness Dependence of the Anisotropy in Thermal Expansion of PMDA-ODA and BPDA-PDA thin films", Thin Solid Films, 1999.

Hodge, T. C., "An in-situ Measurement Technique for Through-Plane Thermal Properties of Thin Dielectric Films", International Conference and Exhibition Multichip Modules, vol. 2256.

Pettit, "Laser Ablation of Polymids", Polymides (16), 1996, pp. 453-470.

Koren et al, "Emission Spectra, Surface Quality, and Mechanism of Excimer Laser Etching of Polyimide Films", Applied Physics Letters, 44 (12), Jun. 15, 1984, pp. 1112-1114.

Liou et al, "Structure—Property Correlation for Thin Films of Semi-Interpenetrating Polyimide Networks. I. Miscibility, Curing, and Morphology Studies", Journal of Applied Polymer Science, vol. 70, Issue 2, 1998, pp. 261-272.

\* cited by examiner

ELECTRONIC DEVICE HAVING A PLASTIC SUBSTRATE

FIELD OF THE INVENTION

The invention relates to the manufacture of an electronic device, such as an active matrix display device, on a plastic substrate.

BACKGROUND OF THE INVENTION

The most common form of active matrix display is an active matrix liquid crystal display (AMLCD). AMLCD devices are usually made on large glass substrates that are 0.7 mm thick. Two plates are needed for a cell, so that completed displays are just over 1.4 mm thick. Mobile phone manufacturers, and some laptop computer manufacturers, require thinner and lighter displays, and completed cells can be thinned in an HF (hydrofluoric acid) solution, typically to about 0.8 mm thick. Mobile phone manufacturers ideally want the displays to be even thinner, but it has been found that cells below 0.8 mm thick made by this method are too fragile.

The HF thinning is not attractive because it is a wasteful process that uses hazardous chemicals that are difficult to dispose of safely and economically. There is also some yield loss during the etching process due to pitting of the glass.

The attractiveness of light, rugged and thin plastic AMLCDs as an alternative has long been recognized. Recently, interest in plastic displays has increased even further, partly due to the increased use of color AMLCDs in mobile phones and PDAs. There has been much research recently into AMLCDs and organic light emitting diode (OLED) displays on plastic substrates. Despite this interest, there is still a need for a plausible manufacturing route for mass production of plastic displays.

A number of different ways have been reported for the manufacture of thin-film transistors (TFTs) or displays on plastic substrates.

One technique is described in WO 05/050754, in which a substrate arrangement is manufactured comprising a rigid carrier substrate and a plastic substrate over the rigid carrier substrate. The rigid carrier substrate is released from the plastic substrate after forming pixel circuits and display cells over the plastic substrate. This enables substantially conventional substrate handling, processing and cell making to be employed.

To release the plastic substrate from a glass carrier a heating method is often used. By heating the glass and the plastic substrate, the plastic substrate and the electronic components formed on the substrate are released from the glass carrier.

There are various methods by which the plastic substrate can be separated from the glass carrier. A release process proposed in WO 05/050754 is a laser lift-off process. Laser light at ultraviolet wavelengths is used to cause the lift-off of the plastic substrate from the underlying carrier. It has been suggested that the release process is a photoablation process due to multiple-photon processes, including localized heating. A suggested material for this process is polyimide, which is chosen for its high-temperature stability and high absorption of UV energy.

There are potential problems in using a heating effect to lift-off the plastic substrate from the glass. Sufficient energy is needed to enable lift off to occur, but without damaging either the plastic substrate or the components formed on it, which may result from thermal expansion effects.

When using a laser lift-off process, higher wavelengths within the UV spectrum are preferable because lower wavelengths are absorbed more by the glass substrate, making the laser release less effective. For example commercially available lasers which operate at 308 nm or 351 nm are preferred.

At these higher wavelengths, the energy absorbed in the plastic layer is statistically distributed without complete thermalisation in the plastic polymer molecules. This gives rise to localized heating effects, which can in turn result in damage to the plastic substrate or the components mounted on it. This can also result in partial or poor lift-off from the carrier.

There is therefore a need for a substrate material which is able to withstand heating without cracking or buckling either of the substrate or the components mounted on it, and which can have good lift-off from a glass substrate.

SUMMARY OF THE INVENTION

According to the invention there is provided a method of manufacturing a thin-film electronic device, the method comprising:

applying a plastic coating to a rigid carrier substrate using a wet casting process, the plastic coating forming a plastic substrate, and comprising a transparent plastic material having a coefficient of thermal expansion at least three times greater in a first direction perpendicular to the substrate plane than in a second direction parallel to the substrate plane;

forming thin film electronic elements over the plastic substrate; and releasing the rigid carrier substrate from the plastic substrate, by a heating process which expands the plastic substrate preferentially in a direction perpendicular to the substrate plane.

The anisotropy of the thermal expansion in the plastic substrate of the invention enables the expansion of the substrate during the thermal lift-off process to be in the perpendicular direction. This has been found to aid the lift-off process and also protect the components mounted on the upper surface of the plastic substrate.

The invention thus provides improved delamination of the plastic substrate, and with reduced buckling and cracking of electronic layers (silicon layers and metal layers) on top of the plastic substrate, through the minimal introduction of lateral stress in these layers.

Preferably, the coefficient of thermal expansion perpendicular to the carrier substrate plane is at least five times that parallel to the rigid carrier substrate plane. More preferably, the coefficient of thermal expansion in the perpendicular direction is at least ten times, and more preferably at least 15 times greater than in the parallel direction.

The plastic layer material preferably comprises a polyimide for example poly(p-phenylene biphenyltetracarboximide). This is a material which can be arranged to have a coefficient of thermal expansion of $105 \cdot 10^{-6}/°C$. (105 ppm/° C.) in one direction and $5 \cdot 10^{-6}/°C$. (5 ppm/° C.) in a second direction. The larger coefficient of thermal expansion is then arranged to be perpendicular to the glass substrate, and this results from the wet casting, in particular spin coating, application process.

The release process may comprise thermal delamination which is performed by exposure to ultraviolet laser light. Preferably, the ultraviolet laser light has a wavelength greater than 200 nm. The rigid carrier substrate preferably comprises a glass substrate.

The plastic is capable of wet casting. The plastic layer can for example be applied to the rigid substrate by a spin-on process, and this plastic substrate then becomes the final device substrate. Alternatively, the plastic can be applied by spreading with a blade or printing techniques such as offset litho or silk screen printing. This enables a very thin layer of plastic material to be applied to a carrier device.

The method can be used for manufacturing an active matrix display device, wherein:

forming thin film electronic elements over the plastic substrate comprises forming an array of pixel circuits over the plastic substrate, and wherein the method further comprises forming a display layer over the array of pixel circuits before releasing the rigid carrier substrate from the plastic substrate.

The invention thus provides a method for the successful separation of a carrier substrate from a plastic display substrate which is formed upon it. This enables substantially conventional substrate handling, processing and cell making to be employed in the manufacture of a display. This then enables the manufacturing process for making active matrix displays on plastic substrates to be carried out in standard factories, with only minimal extra equipment needed.

The plastic displays can be made on standard glass substrates, and these can be re-used many times. This invention can be applied for example for LCDs, PLED or OLED displays and electrophoretic displays, and with amorphous silicon (a-Si) or low-temperature polycrystalline silicon (LTPS) TFTs.

The method may further comprise manufacturing a second substrate arrangement, and wherein forming a display layer over the array of pixel circuits comprises mounting the first and second substrate arrangements with electro-optic material sandwiched therebetween, the active matrix display device thereby comprising first and second substrates with the electro-optic material sandwiched therebetween.

The process essentially allows the TFTs to be fabricated on plastic layers, interconnects to be made, and some packaging to be carried out while the plastic layer is still stuck to the glass. The release is carried out after the cell formation. This is attractive for all plastic substrate applications, and is a particularly attractive process for making displays on flexible substrates.

The invention also provides a thin-film electronic device, comprising:

a plastic substrate comprising a transparent plastic material, the plastic substrate having a coefficient of thermal expansion which is at least three times greater in a direction perpendicular to the substrate plane than in a direction parallel to the substrate plane; and thin film electronic elements over the plastic substrate.

BRIEF DESCRIPTION OF THE DRAWINGS

Examples of the invention will now be described in detail with reference to the accompanying drawings, in which.

DETAILED EMBODIMENTS

The invention relates generally to the manufacture of thin-film electronic devices on plastic substrates, and concerns a process in which a thermal release process of a plastic substrate from a rigid carrier substrate is used. The invention concerns in particular the plastic material and arranges a coefficient of thermal expansion to be greater in a first direction perpendicular to the substrate plane than in a second direction parallel to the substrate plane. This improves the thermal lift-off process and prevents damage to the circuit components carried by the substrate during the thermal lift-off process.

The invention has particular application to the manufacture of an active matrix display device, and an example of the invention will be described in this context.

Figure 1:
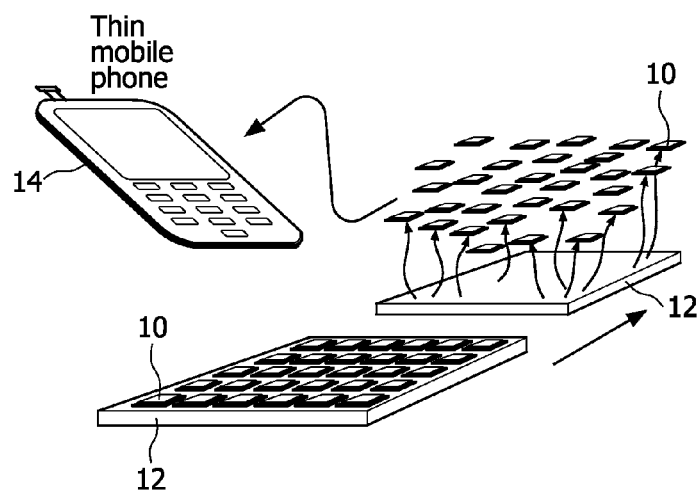
FIG. 1 shows manufactured displays made in accordance with the invention being released from a common glass substrate for use in a mobile phone.

FIG. 1 shows schematically the fabrication of plastic displays in accordance with the invention, and shows the final release stage, which is improved by this invention. Completed displays 10 are released from a glass substrate 12 and are then used in devices such as a mobile phone 14.

Figure 2:
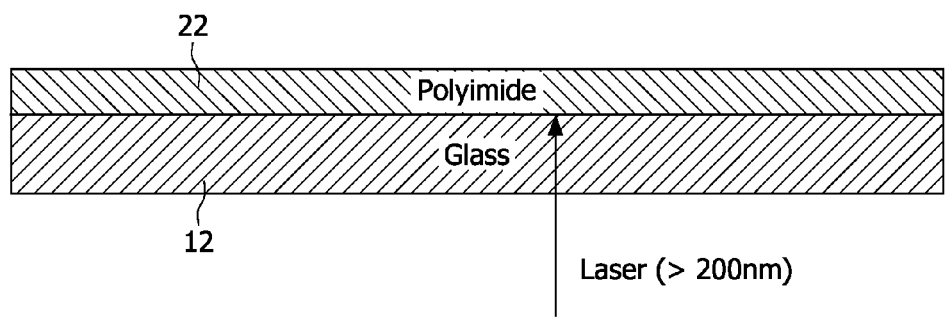
FIG. 2 shows a known laser release process.

FIG. 2 shows an example of a known arrangement where a polyimide layer 22 is spincoated onto a glass carrier 12. The polyimide layer 22 forms the substrate after it has been separated from the glass carrier 12 by a laser lift-off process.

Figure 3:
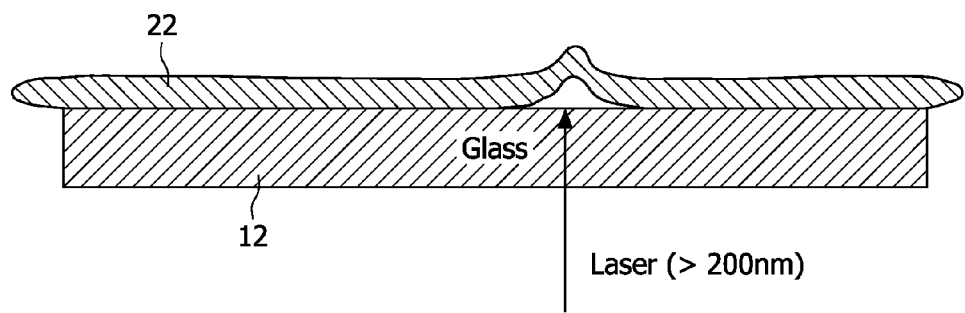
FIG. 3 shows buckling which can occur in the known release process, and which can cause cracking of the surface layers.

FIG. 3 shows one possible problem which can arise during the thermal laser lift-off. Particularly when higher wavelength laser illumination is used, for example with 351-nm excitation, the absorbed energy from the laser is distributed without complete thermalisation of the polyimide molecules, leading to dissociation of the weakest bonds. The localized thermal heating of the material causes the polyimide layer 22 to buckle as shown in FIG. 3, and this damages the layers on top of the substrate.

One example of the method of the invention will now be described in detail, to show how a display can be made using laser release from a glass substrate, and with inkjet printing for color filters of the display, and VALC (Vacuum Alignment with Liquid Crystal) for cell making The example shown in detail is for the manufacture of liquid crystal (LC) display cells, having LC material sandwiched between two opposite (active and passive) substrates. The invention can be applied to many other display technologies and to non-display technologies, and the specific example is for illustration only.

Figure 4:
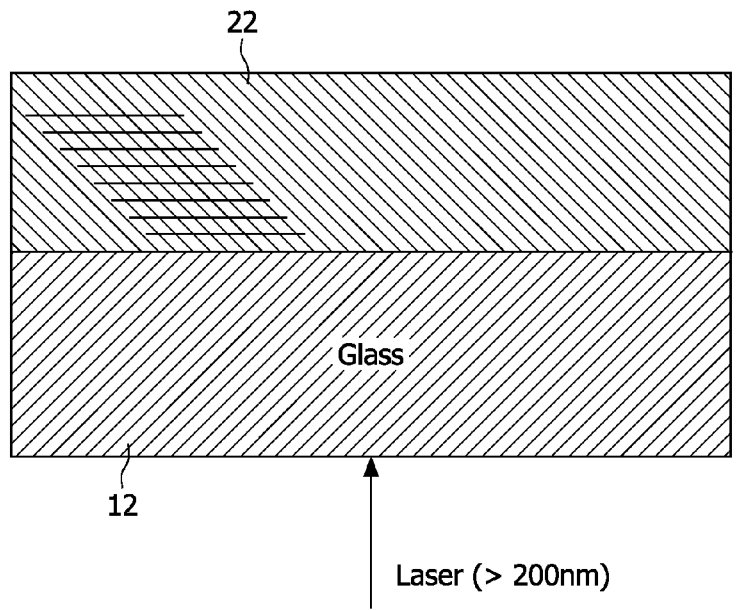
FIG. 4 shows a substrate according to the invention.

FIG. 4 shows a glass carrier plate 12 and a plastic layer 22 which functions as a plastic substrate. A substrate in this form can form the basis of the active plate and the passive plate.

The plastic layer 22 must be strong enough to be one of the walls of the completed cell. In addition, the plastic layer 22 should be transparent and ideally non-birefringent. Furthermore, the plastic layer 22 should be able to absorb laser energy to effect lift-off of the plastic layer 22 from the carrier plate 12.

The invention concerns the material for the plastic layer 22, and proposes the use of a plastic material with characteristics to make it suitable for a thermally-induced lift-off process.

The substrate material for the plastic layer 22 should have a tensile strength of >200 MPa, and be non-birefringent. It should also be deposited using a wet casting process, for example spin-coating.

The spin-coating gives an extremely high quality surface and can give an extremely thin layer if required. Most importantly, the plastic layer 22 is capable of wet casting. The plastic layer 22 can thus instead be applied by spreading with a blade or printing techniques such as offset litho or silk screen printing.

The substrate formed from the plastic layer 22 can comprise a number of polymers.

It has already been recognized that the polymer should be transparent and which may be wet cast (for example spin coated) from solution to produce a transparent and preferably non-birefringent film.

All materials have a coefficient of thermal expansion. During the transfer of heat to a material, there is a change to the energy stored in the intermolecular bonds at an atomic level. As the energy stored by the bonds between the atom increases, so will the length of each bond. This gives rise to an expansion of a solid on heating, and a contraction of the solid on cooling. Materials with a volumetric coefficient of thermal expansion which is distributed unequally in the x, y and z planes are called anisotropic materials.

The invention is based on the recognition that materials with large anisotropy in the coefficient of thermal expansion (CTE) in one direction in comparison to a second direction are particularly suited to a laser lift-off process.

In accordance with the invention, materials with a large anisotropy of CTE are aligned on the glass carrier substrate so that the largest CTE is perpendicular to the glass substrate. The CTE is at least three times larger perpendicular to the glass substrate than parallel to the glass substrate.

These CTE characteristics allow the plastic substrate to be thermally delaminated from the glass substrate 12, with the plastic layer 22 expanding in this perpendicular direction rather than buckling as shown in FIG. 2. This also reduces potential damage to the device layers mounted on the plastic substrate.

FIG. 4 shows a polyimide plastic layer 22 with a perpendicular CTE higher than the parallel CTE.

An example of a polyimide to be used as a plastic substrate with the characteristics as outlined above is poly(p-phenylene biphenyltetracarboximide). This particular polymer has rigid rod-like chains. It has significantly higher anisotropy in the thermal expansion coefficient than shown in other materials.

In use, the poly(p-phenylene biphenyltetracarboximide) does not distort, crack or buckle when exposed to excitation wavelengths, even when these are high wavelengths of the UV spectrum, for example greater than 200 nm.

By way of example, poly(p-phenylene biphenyltetracarboximide) has a CTE value in one direction of 105 ppm/° C. and a CTE in a second direction of approximately 5 ppm/° C. The largest CTE value is aligned to be perpendicular to the glass carrier plate 12, and parallel to the direction of the application of the heat or laser.

The large anisotropy in the CTE is a feature both of the material (resulting from its crystalline content) and the deposition process. A spin coating process provides in-plane orientation of the polymer molecular chains, and this contributes to the high anisotropy.

A spin coating process is a costly process, as much of the material is wasted. A slit or blade coating process may therefore be preferred, and will again provide the in-plane molecular alignment giving rise to the required anisotropy. The viscosity of the polyimide may need to be adjusted to make slit coating suitable.

Although the specific example of material given displays a large anisotropy in the coefficient of thermal expansion (a factor of 20), the difference in the two values does not need to be so prominent in order for the invention to function. Preferably, the CTE of the material perpendicular to the glass carrier is at least three times that of the CTE parallel to the substrate, i.e. a factor of at least 3. More preferred arrangements have a factor of more than 4, for example in the range 4-7. As in the specific example above, the factor may be more than 10.

The actual CTE value is preferably less than 30 ppm/° C. in the parallel direction, for example in the range 20 ppm/° C. to 30 ppm/° C. However, the CTE value in the parallel direction may be even lower, for example less than 10 ppm/° C. In particular, the CTE can be matched to the underlying glass substrate, and/or to the layers to be deposited onto the plastic substrate.

FIGS. 5A to 5M show schematic diagrams for sequential stages of one fabrication scheme. For clarity, these figures show only one display being made, but in practice there would be many displays on large glass substrates, as shown in FIG. 1.

Figure 5A:
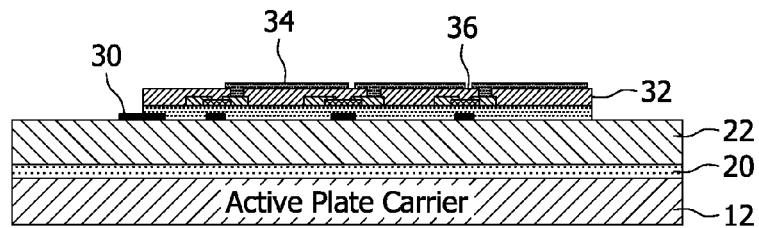
FIGS. 5A to 5M show the processing steps for one example of method of the invention starting with the substrate of FIG. 4 for producing a first example of display of the invention.

FIG. 5A shows the active plate, in which a-Si TFT arrays have been made on the plastic surface using (almost) standard processing. The plastic substrate 22 is in accordance with the invention as outlined above. FIG. 5A also shows an optional release layer 20, for example an amorphous silicon layer, to assist the release of the plastic substrate from the glass carrier.

The maximum processing temperature will depend upon the plastic layer chosen, but it could be higher than for free-standing plastic films because the plastic is securely anchored to the rigid glass substrate 12 and there are no problems with shrinkage.

The TFT array comprises a gate metal layer 30, a silicon nitride gate dielectric layer 32 and ITO pixel electrodes 34. The TFTs are shown schematically as 36.

Figure 5B:
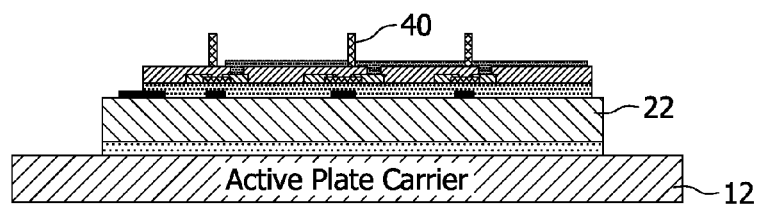

FIG. 5B shows the addition of column spacers 40 for the LC cell. These could either be made by inkjet printing or spinning on a suitable polymer layer and then patterning by photolithography. Dispersed glass or plastic beads or rods could also be used instead, but column spacers that stick to both substrates can give plastic cells increased mechanical strength and help protect the cell from separating.

Figure 5C:
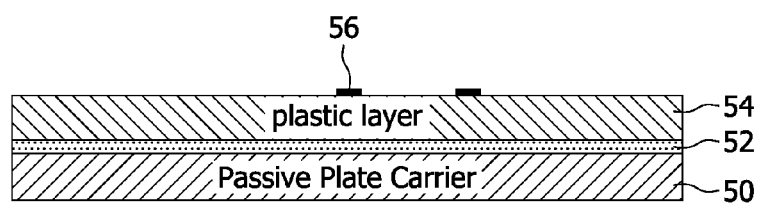

FIG. 5C shows the fabrication of the passive plate substrate. The passive plate also comprises a glass substrate 50, and optional release layer 52 and a plastic substrate 54 (which may be the same plastic as used for the active plate or may be a different plastic). FIG. 5C also shows black mask layers 56. This demonstrates another advantage of fabricating plastic displays in this way, which is that structures can be built into the substrate. The black mask 56 could also be made at a later stage using standard methods.

Figure 5D:
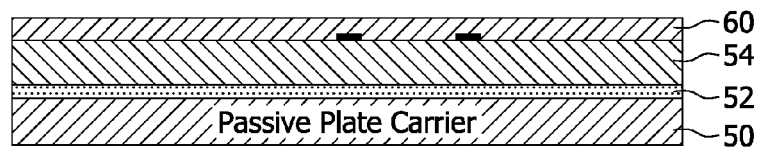

As shown in FIG. 5D, a second polymer layer 60 is added to the passive plate layers. This step is only needed if a buried black mask layer is used.

Figure 5E:
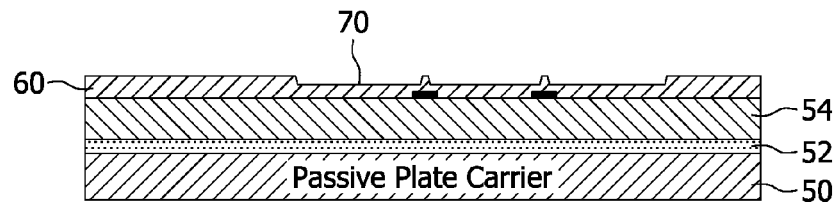

As shown in FIG. 5E, recessed wells 70 are etched into the passive carrier plate. This step is only needed if color filters are to be inkjet printed. These wells serve to define accurately the shape of the color filter pixels. The wells can be etched into the plastic layer either by photolithography and oxygen plasma, laser ablation or by stamping with a hard mask.

Figure 5F:
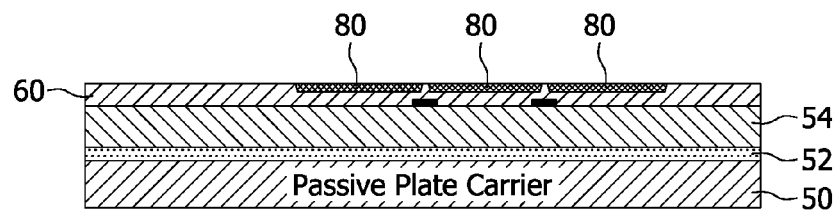

FIG. 5F shows the passive carrier plate after inkjet printing of the color filter layers 80.

Figure 5G:
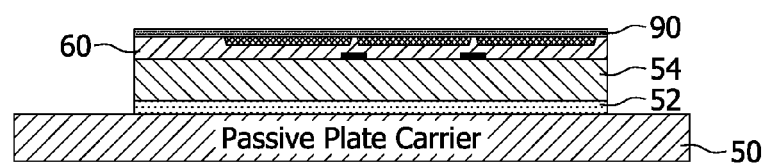

FIG. 5G shows an ITO layer 90 sputtered onto the glass substrate. Furthermore, discrete display devices are formed over the common active plate glass substrate by etching away the ITO, plastic and a-Si release layer.

At this stage, different process routes may be taken, depending on whether traditional cell making is used, or the newer Vacuum Alignment with Liquid Crystal (VALC) method, sometimes called drop filling. In this drop filling method, LC droplets are put onto one of the plates before alignment and plate coupling is carried out under vacuum. By way of example, the following diagrams are for the VALC process.

Figure 5H:
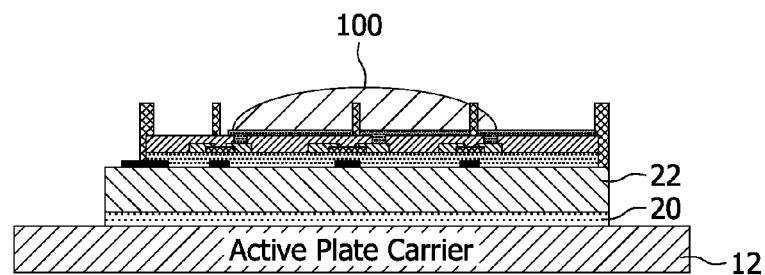

FIG. 5H shows an LC drop 100 put on the active plate area of the plastic display.

Figure 5I:
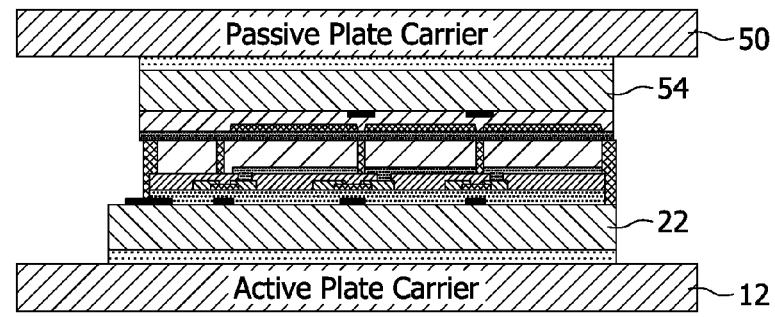

The assembled panel of FIG. 5I is then formed by using the VALC process.

One of the glass plates is then removed from the plastic layer.

As detailed above, a laser release process is preferably used, but other heating methods may be employed, for example lamp heating through the glass of the release layer or bottom of the plastic layer, or by heating the glass plate on a hot plate.

The release process is improved by virtue of the use of a plastic material of the invention.

Figure 5J:
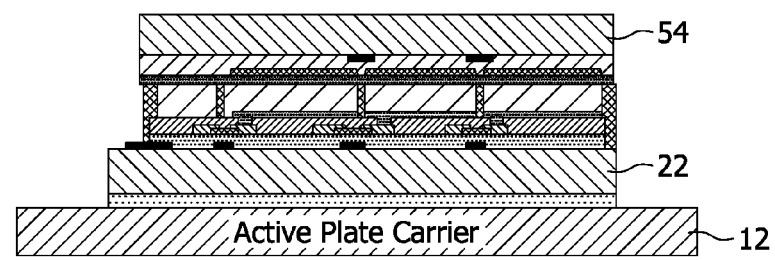

FIG. 5J shows the glass substrate of the passive plate removed. With a laser release process, the laser is applied at a wavelength greater than 200 nm to the passive glass carrier plate. Examples of wavelength for this purpose are 308 nm or 351 nm.

Once the plastic layer has separated from the carrier plate, the passive glass carrier plate can then be cleaned to remove all traces of residues from the passive plate process before being re-used.

Figure 5K:
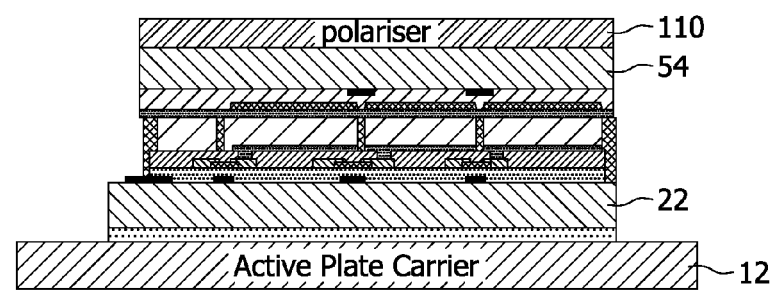

As shown in FIG. 5K, a polarizer 110 is then added. It is easier to do it at this stage before final release of the display because the display still has rigidity due to its coupling to the glass. The polarizer also gives added strength to the top plastic layer. A chip-on-glass process can also be done at this stage, or interconnect foils added. The advantage of doing this at this stage is that the plastic sheet is still firmly stuck to the glass, simplifying alignment and fixing.

Figure 5L:
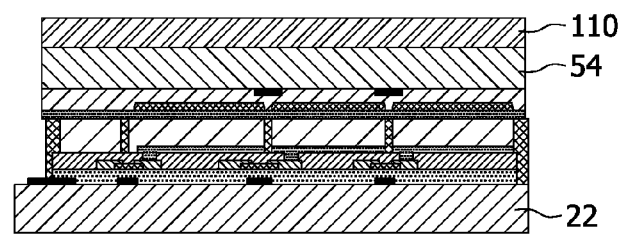

As shown in FIG. 5L, the plastic substrate of the active plate is also released by a similar method described above from the active plate glass substrate 12, which can also be cleaned and used again.

Figure 5M:
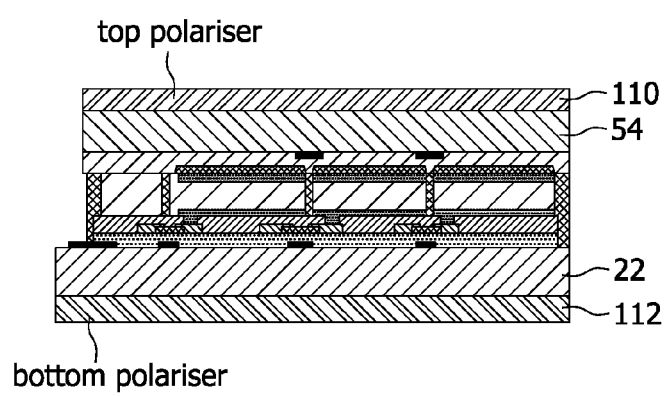

A polarizer film is also applied to the plastic substrate 22 of each active plate. The second polarizer 112 is shown in FIG. 5M, which shows the completed display.

The polarizer must be applied display-by-display in this case. If VALC is not used, then interconnects are made after formation of the completed cells shown in FIG. 5M.

The plastic substrates are released from the glass substrate by laser release from the plastic that is directly in contact with the glass substrate.

Laser irradiation (XeCl) can be used through the glass substrate. A thin layer, <1 μm, is photo-ablated leaving free-standing polymer films with good mechanical integrity.

The glass substrate may be cleaned before the wet casting deposition process so that surface contaminants such as oils and ions are removed prior to the coating process. Conventional solvents can be used to perform the cleaning process.

The examples above relate to the manufacture of an active matrix display device. In further aspects, the invention relates more generally to the production of electronic devices comprising thin-film circuitry on a plastic substrate. Thus, the invention also applies more generally to forming thin-film electronic elements over a plastic substrate supported by a rigid carrier substrate, and then releasing the rigid carrier substrate from the plastic substrate. These devices may, for example, comprise solar cells, large area lighting panels, and flexible thin-film electronic devices for applications in wearable or medical systems. Again, substantially conventional substrate handling can thus be used in the processing of a thin-film electronic device (for example having TFTs) on a plastic substrate. The use of a wet cast (e.g. spin-on) process gives a flat, high quality surface.

The wet cast (e.g. spin-on) process enables very thin substrates to be formed. For example a substrate may be formed with thickness as low as 3 μm.

The examples of manufacturing method described in detail above are in connection with an LCD display. However, it will be apparent to those skilled in the art that there are many variations to each of the steps described.

More generally, the invention provides firstly the application of plastic to a substrate. The thickness of the plastic layers will normally be in the thickness range 2 μm to 50 μm. This plastic will ultimately become the plastic substrate of the display, for display applications. Suitable wet casting processes are spin coating, printing and spreading.

The substrate can be either a standard glass substrate or a glass substrate coated with a blue-light absorbing layer. The choice depends on the plastic used and laser release properties.

A passivation layer will normally be desired, applied above the plastic layer. Suitable layer types are silicon nitride or silicon oxide deposited by plasma-enhanced chemical vapour deposition (PECVD) or sputtering.

TFT arrays are then be made on the plastic/passivation layer. The TFT array fabrication can be carried out under fairly standard array processing conditions for a-Si or low-temperature poly-Si (LTPS) TFTs. There may have to be some small process changes to ensure that the deposited layers do not have high mechanical stress. The use of standard glass substrates coated with very thin layers of plastic and standard TFT array processing means that this process can be used in existing TFT fabrication plants.

TFTs can be used as the active device element for multiplexing several different display types, not only the LCD example above. Whatever the display type is, the display is fabricated while the TFT array is still stuck onto the glass. This means that standard display fabrication tools and techniques can be used and the presence of a thin layer of plastic will not cause any significant differences. The display drivers can also be bonded to the display at this time.

The laser used to remove the plastic substrate from the carrier is applied through the glass substrate to hit the bottom of the plastic. The laser for this purpose will normally have to be scanned to cover the complete area of the display. Pulsed excimer lasers with wavelengths of 308 nm and 351 nm can be used.

The invention enables direct laser release of a clear plastic substrate, and such a substrate can be used with all display types, including transmissive and transflective LCDs and downward emitting organic LEDs (OLEDs), such as a polymer LED.

As mentioned above, a liquid crystal display is only one example of display technology which can benefit from the invention.

Poly(p-phenylene biphenyltetracarboximide) is mentioned as a preferred example of a material in one embodiment of the invention. It will be recognized by the person skilled in the art that a material displaying similar characteristics with large anisotropy of coefficient of thermal expansion may also be used to achieve the same result.

Figure 6:
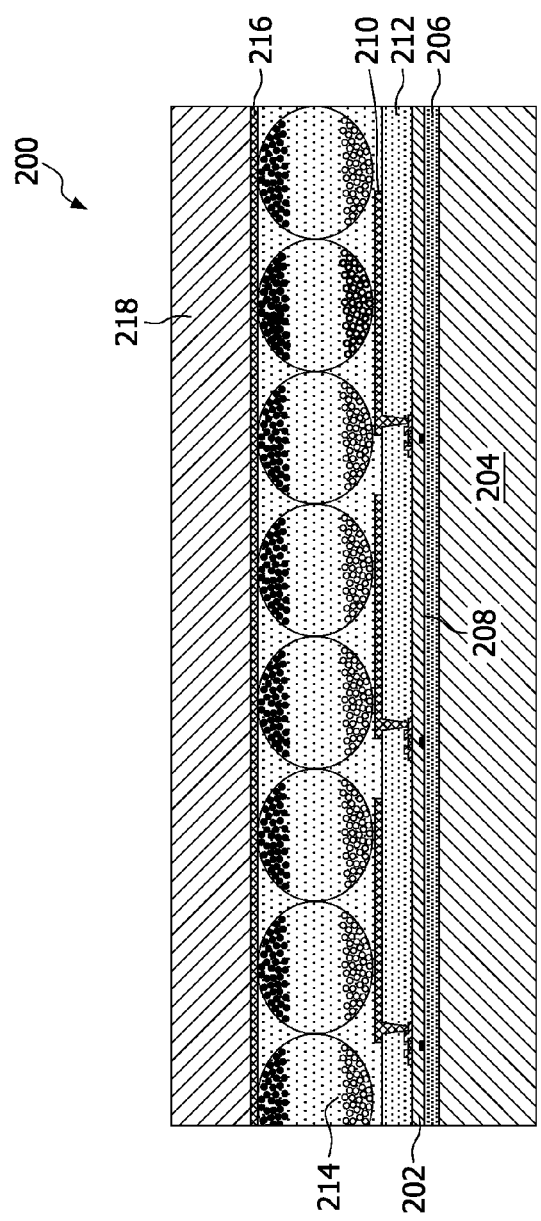
FIG. 6 shows a second example of manufactured display of the invention.

As an example of alternative display technology, FIG. 6 shows a reflective display device 200 using electrophoretic display material. An example of this type of display is known as an E-Ink display. An array of thin film transistors 202 is formed on a plastics layer 204 on glass. The TFT array is provided over a silicon nitride passivation layer 206 and a silicon nitride gate insulator layer 208, and the ITO pixels 210 are formed over a polymer passivation layer 212. The glass substrate is not shown in FIG. 6, which shows the final removed display device.

A layer of electrophoretic material comprises capsules 214 and is laminated onto the TFT array. The capsules are responsive to a local electric field across the ink foil layer. This layer is inherently tacky, and is placed on the TFT array and heated, to approximately 100 degrees Celsius, and rolled. The display modules are finished with a ITO layer 216 and a plastic protective layer 218.

Driver chips mounted onto foils are then connected to lead-in areas, and the laser release step is then carried out.

Figure 7:
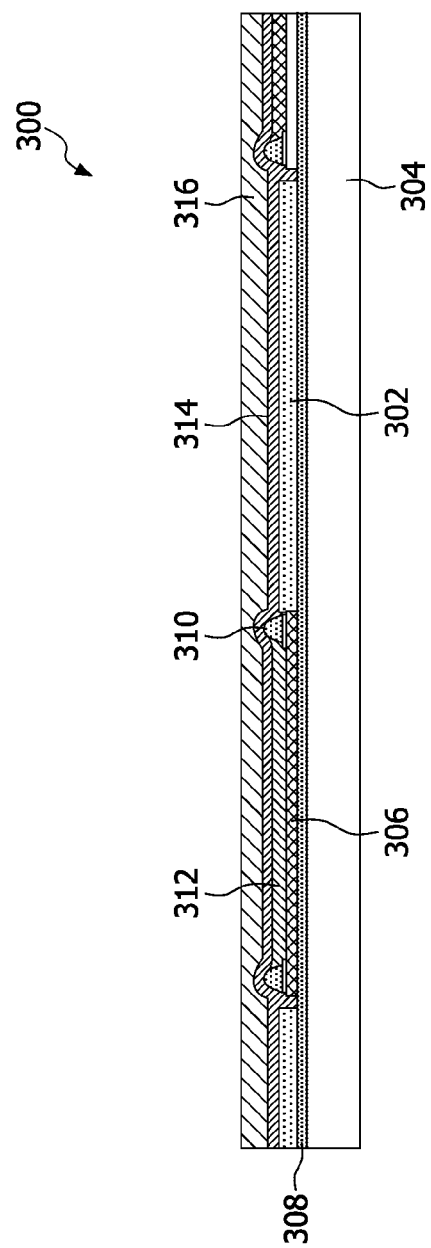
FIG. 7 shows a third example of manufactured display of the invention.

FIG. 7 shows an example polymer LED downwardly-emitting display device 300. An array of encapsulated thin film transistor circuits 302 are formed on a clear plastic (such as silicone, BCB or parylene) substrate 304, and with transparent ITO pixel electrodes 306 formed over a silicon nitride passivation layer 308.

A hydrophilic polymer wall 310 surrounds the pixel (although this is not required for organic LEDs) which is defined by the polymer (or organic) LED material 312. A metal cathode 314, such as Ca, covers the structure, and is covered by a polymer passivation layer 316.

The examples of FIGS. 6 and 7 are manufactured in accordance with the invention, and it will be appreciated that numerous other specific display designs, as well as other electronic component designs, can be made using the approach explained above. For example, suitable display types include OLED (organic LED), PLED (polymer LED), EL (electroluminescent) and PDLC (polymer-dispersed liquid crystal) displays, as well as LCDs.

Some examples of polyimide are given above. Other examples are PMDA-PDA and BPDA-PDA. It is also possible to fluorinate high anisotropy polyimides to increase their transparency. Other examples of materials which are spincoatable are from the BCB family (benzocyclobutane) or polybenzoxozole. The invention is thus not limited to polyimides.

Various other modifications will be apparent to those skilled in the art.

The invention claimed is:

1. A method of manufacturing a thin-film electronic device, the method comprising:
   applying a fluorinated plastic coating to a rigid carrier substrate using a wet casting process, the rigid carrier substrate being in a substrate plane, and the plastic coating forming a plastic substrate, wherein fluorination provides improved transparency of the coating;
   aligning the transparent plastic material on the rigid carrier substrate so that a coefficient of thermal expansion (CTE) of the transparent plastic material is at least three times greater in a first direction perpendicular to the substrate plane than in a second direction parallel to the substrate plane, wherein the CTE of the transparent plastic material parallel to the substrate is matched to a CTE of the rigid carrier substrate;
   forming a plurality of thin film electronic elements over the plastic substrate; and
   releasing the rigid carrier substrate from the plastic substrate, by a heating process which expands the plastic substrate in a direction perpendicular to the substrate plane.

2. The method as claimed in claim 1, wherein the plastic material has a greatest coefficient of thermal expansion in a direction substantially perpendicular to the rigid carrier substrate.

3. The method as claimed in claim 1, wherein the plastic material has a less coefficient of thermal expansion in a direction substantially parallel to the rigid carrier substrate.

4. The method as claimed in claim 1, wherein the coefficient of thermal expansion of the plastic material perpendicular to the rigid carrier substrate is at least five times that parallel to the rigid carrier substrate.

5. The method as claimed in claim 4, wherein the coefficient of thermal expansion of the plastic material perpendicular to the rigid carrier substrate is at least then times that parallel to the rigid carrier substrate.

6. The method as claimed in claim 1, wherein the coefficient of thermal expansion of the plastic material parallel to the rigid carrier substrate is less than $30 \times 10^{-6}/°$ C.

7. The method as claimed in claim 1, wherein the plastic material comprises a polyimide.

8. The method as claimed in claim 7, wherein the plastic material comprises poly(p-phenylene biphenyltetracarboximide).

9. The method as claimed in claim 1, wherein the release is by thermally delaminating the plastic substrate from the rigid carrier substrate.

10. The method as claimed in claim 9, wherein the thermal delamination is performed by exposure to ultraviolet laser light.

11. The method as claimed in claim 10, wherein the ultraviolet laser light has a wavelength greater than 200 nm.

12. The method as claimed in claim 1, wherein the rigid carrier substrate comprises a glass substrate.

13. The method as claimed in claim 1, wherein the wet casting process comprises a spin-on process.

14. The method as claimed in claim 1:
   forming the plurality of thin film electronic elements over the plastic substrate comprises forming an array of pixel circuits over the plastic substrate, and
   forming a display layer over the array of pixel circuits before releasing the rigid carrier substrate from the plastic substrate.

15. The method as claimed in claim 14, further comprising manufacturing a second substrate arrangement, and wherein forming a display layer over the array of pixel circuits comprises mounting the first and second substrate arrangements with electro-optic material sandwiched therebetween, the active matrix display device thereby comprising first and second substrates with the electro-optic material sandwiched therebetween.

16. A thin-film electronic device comprising:
   a fluorinated, transparent, plastic substrate with a plurality of thin film electronic elements formed on a surface, the plastic substrate formed by:
   coating a surface of a rigid carrier substrate with a fluoridated, transparent, plastic material using a wet casting process, wherein the fluorination provides improved transparency of the coating;
   aligning the transparent plastic material on the rigid carrier substrate so that a coefficient of thermal expansion (CTE) of the transparent plastic material is at least three times greater in a first direction perpendicular to the substrate plane than in a second direction parallel to the substrate plane, wherein the CTE of the transparent plastic material parallel to the substrate is matched to a CTE of the rigid carrier substrate;
   forming a plurality of thin film electronic elements over the plastic substrate; and releasing the rigid carrier substrate from the plastic substrate, by a heating process which expands the plastic substrate in a direction perpendicular to the substrate plane.

17. A system for manufacturing a thin-film electronic device, the system comprising:
- a wet caster configured for applying a fluorinated, transparent, plastic coating to a rigid carrier substrate using a wet casting process, the rigid carrier substrate being in a substrate plane, and the plastic coating forming a plastic substrate, wherein fluorination provides improved transparency of the coating;
- an aligner configured for aligning the transparent plastic material on the rigid carrier substrate so that a coefficient of thermal expansion (CTE) of the transparent plastic material is at least three times greater in a first direction perpendicular to the substrate plane than in a second direction parallel to the substrate plane, wherein the CTE of the transparent plastic material parallel to the substrate is matched to a CTE of the rigid carrier substrate;
- a thin film element former configured for forming a plurality of thin film electronic elements over the plastic substrate; and
- a heated substrate releaser configured for releasing the rigid carrier substrate from the plastic substrate, using a heating process which expands the plastic substrate in a direction perpendicular to the substrate plane.

* * * * *